United States Patent
Mutsui et al.

(10) Patent No.: US 6,869,482 B2
(45) Date of Patent: Mar. 22, 2005

(54) APPARATUS FOR MANUFACTURING A DRY SHEET FROM A SLURRY

(75) Inventors: Norio Mutsui, Gamo-Gun (JP); Tamotsu Mitsutani, Omihachiman (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 10/601,393

(22) Filed: Jun. 23, 2003

(65) Prior Publication Data

US 2004/0149207 A1 Aug. 5, 2004

(30) Foreign Application Priority Data

Jul. 10, 2002 (JP) ........................................ 2002-201767
Jun. 17, 2003 (JP) ........................................ 2003-172534

(51) Int. Cl.$^7$ .............................................. B05C 11/10
(52) U.S. Cl. ...................... 118/665; 118/672; 118/688; 118/712
(58) Field of Search ................................. 118/689, 677, 118/672, 664, 665, 670, 688, 712, 713, 413, 414; 427/8, 9, 10; 425/97, 141

(56) References Cited

U.S. PATENT DOCUMENTS 4,698,192 A * 10/1987 Kuze et al. ................. 264/101
5,958,137 A * 9/1999 Caldwell et al. ............ 118/663
6,096,370 A * 8/2000 Mori et al. .................... 427/9

FOREIGN PATENT DOCUMENTS

JP      11-77627       3/1999

OTHER PUBLICATIONS

IBM Technical Disclosure Bulletin NN77044162, Apr. 1, 19977, IBM, "Calibration Fixture for Green Ceramic Sheet Thickness Senor", vol. 19, Issue 11, p. 4162.*

* cited by examiner

*Primary Examiner*—Chris Fiorilla
*Assistant Examiner*—George Koch
(74) *Attorney, Agent, or Firm*—Ostrolenk, Faber, Gerb & Soffen, LLP (57) ABSTRACT

A slurry raw material is applied onto a carrier film 3 in a coating section 4, and a predetermined property related to the thickness of the slurry raw material is measured in a property-measuring section 5 in a wet mode before the slurry raw material is dried in a drying section 6. A processing sub-section 7a calculates an estimated value t of the thickness of a sheet from the target thickness of the sheet, a measurement of the slurry raw material property, and the slurry raw material density, to compare the estimated value t with the target value T of the sheet thickness. An adjusting output sub-section 7b transmits signals for adjusting the thickness to a thickness-adjusting device 9 on the basis of the above comparison result, to efficiently and precisely control the thickness of the slurry raw material applied onto the carrier film 3.

10 Claims, 5 Drawing Sheets

SLURRY DENSITY

FIG. 4

RELATIONSHIP BETWEEN SLURRY DENSITY AND CONVERSION COEFFICIENT
(t=100 μm)

FIG. 5

APPARATUS FOR MANUFACTURING A DRY SHEET FROM A SLURRY

BACKGROUND OF THE INVENTION

1. Field of the Invention

The present invention relates to an apparatus for manufacturing a sheet such as a ceramic green sheet.

2. Description of the Related Art

Ceramic green sheets have been conventionally used for manufacturing monolithic ceramic capacitors and multilayer ceramic substrates. Since the miniaturization of electronic devices has been advancing, such ceramic green sheets are required to be thinner accordingly. However, thinner ceramic green sheets become mechanically weaker and more fragile. Therefore, flexible carrier films are prepared, on which ceramic green sheets are formed. According to this method, a ceramic green sheet backed with a carrier film can be obtained.

Japanese Unexamined Patent Application Publication No. 11-77627 discloses a conventional apparatus for manufacturing a ceramic green sheet using a carrier film, comprising a means for transferring a carrier film, an applying means for applying ceramic slurry onto the carrier film, and a drying means, such as a drying oven, for drying the ceramic slurry on the carrier film to form a sheet.

In the conventional ceramic green sheet-manufacturing apparatus, in order to control the green sheet thickness, the following process is generally used. The thickness of a dried sheet is measured. Then, a measurement of the thickness is fed back to the ceramic slurry-applying means, whereby the coating thickness of the ceramic slurry applied onto the carrier film is adjusted. However, in this process, the feedback is delayed and the thickness cannot be efficiently controlled.

On the other hand, it has been proposed to measure the coating thickness of the ceramic slurry applied onto the carrier film in a wet mode before drying, by use of a special optical measuring instrument. In this technique, however, the final thickness of the sheet that will exist after drying must be precisely estimated, from the coating thickness of the wet ceramic slurry at the time of its measurement. If the estimation is not precise, the thickness cannot be precisely controlled.

SUMMARY OF THE INVENTION

In response to the foregoing problems, the present invention provides a sheet-manufacturing apparatus in which a carrier film is used with efficiency and precision in control of the sheet thickness.

In order to solve the above problems, the inventors have conducted various experiments. As a result, the inventors have found that the thickness of a dried sheet can be substantially precisely estimated by using a density of a slurry raw material, and have made the following invention on the basis of this finding.

An embodiment of the present invention provides a sheet-manufacturing apparatus including a coating section for applying a slurry raw material to be formed into a sheet, onto a carrier film transferred along a predetermined route;

a thickness-adjusting section for adjusting the thickness of a coating of the slurry raw material on the carrier film;

a drying section for drying the slurry raw material on the carrier film to form a sheet;

a property-measuring section for measuring a predetermined property, related to the coating thickness of the slurry raw material on the carrier film, in a wet mode before drying in the drying section;

a memory section for storing data which represents a relationship among the measured value of the property of the slurry raw material on the carrier film, the density of the slurry raw material, and the thickness of the sheet to be obtained by drying the slurry raw material;

an operational section for estimating the final sheet thickness on the basis of the data stored in the memory section, by calculation from the value of the property of the slurry raw material measured in the property-measuring section, and the density of the slurry raw material, and comparing the estimated value with a target value of the sheet thickness; and an output adjusting section for transmitting thickness-adjusting signals to the thickness-adjusting section on the basis of a comparison result obtained in the operational section.

The property related to the thickness in this embodiment of the invention is a characteristic which varies according to a change in thickness during the conversion of the slurry raw material into a sheet. In the disclosed embodiment for example, the property is a radiation attenuation amount; and the property-measuring section includes a radiation thickness gauge. Alternatively, the property could be a laser beam reflection intensity, and in that case, the property-measuring section would include a laser thickness gauge.

In the above sheet-manufacturing apparatus, the thickness of the final sheet (an estimated value of the sheet thickness) obtained from the slurry raw material is calculated based on data, stored in the memory section in advance, in combination with the following input data: the target thickness of the sheet, the measurement of the density of the slurry raw material, and the measurement of the predetermined property related to the coating thickness of the slurry raw material. Subsequently, in the operational section, the estimated sheet thickness is compared with the target sheet thickness and comparison data is fed back to the thickness-adjusting section for causing the estimated sheet thickness to move closer to the target sheet thickness. Thereby, the coating thickness of the slurry raw material applied onto the carrier film is adjusted to an appropriate value.

In this procedure, since the predetermined property related to the coating thickness of the slurry raw material on the carrier film, which is the basis of the estimated sheet thickness, is measured before the slurry material is dried, the data feedback is not delayed, whereby the thickness of the sheet can be controlled more efficiently.

Furthermore, in the calculation of the estimated sheet thickness, every factor which is thought to have an effect on the sheet thickness obtained after drying is considered. Therefore, the estimated sheet thickness is extremely close to a sheet thickness actually obtained after drying. Thus, the final thickness can be precisely controlled in response to the estimated sheet thickness.

Other features and advantages of the present invention will become apparent from the following description of embodiments of the invention which refers to the accompanying drawings.

BRIEF DESCRIPTION OF THE DRAWINGS

FIGS. 1 to 5 illustrate an embodiment of the present invention.

FIGS. 3 to 5 are graphs showing the relationship between the density of ceramic slurry, which is a raw material, and a conversion coefficient necessary for calculating the thickness of a green sheet.

DESCRIPTION OF EMBODIMENTS OF THE INVENTION

Figure 1:
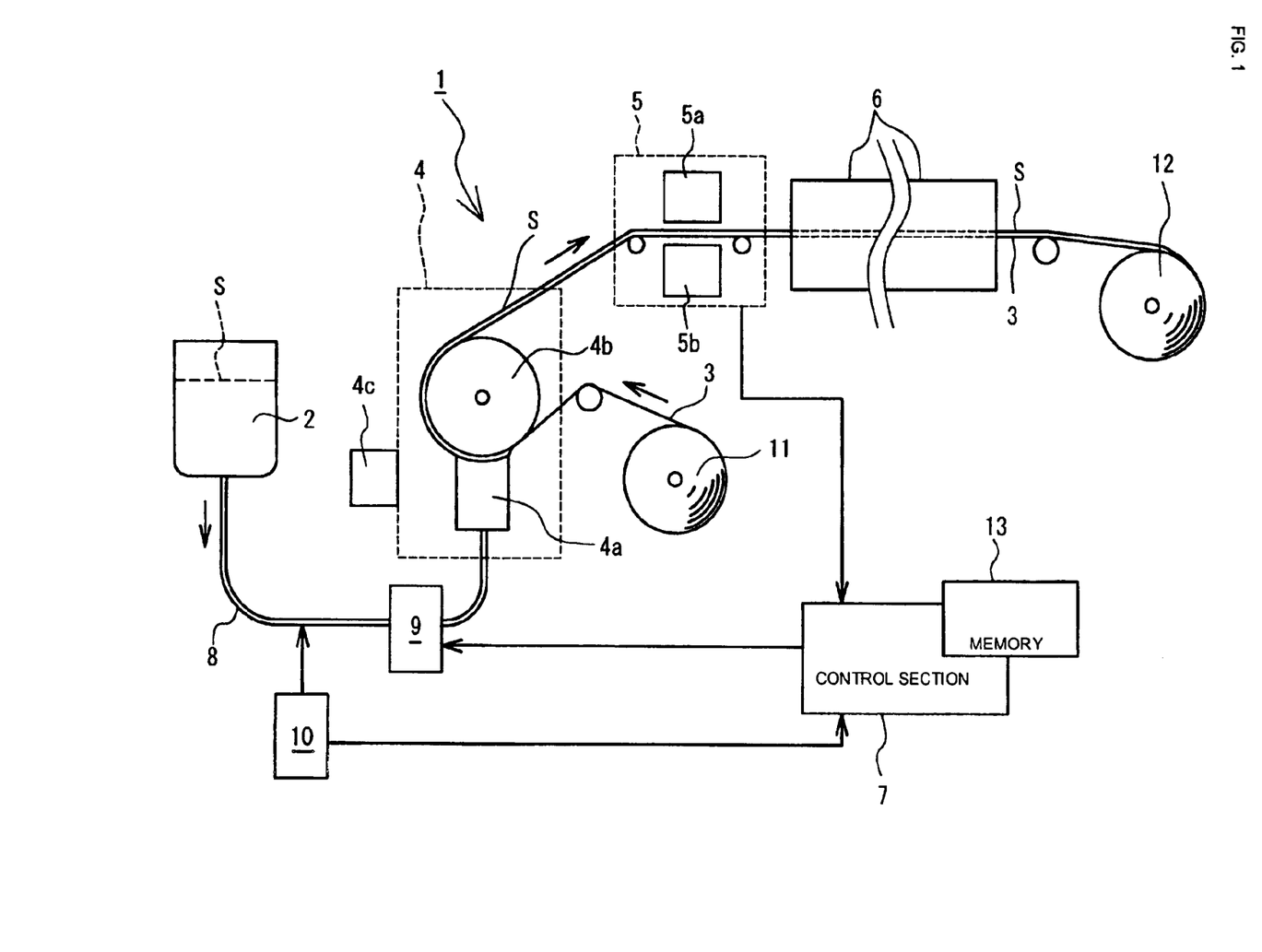
FIG. 1 is an illustration showing a configuration of a ceramic green sheet-manufacturing apparatus according to the embodiment of the present invention.

As shown in FIG. 1, the ceramic green sheet-manufacturing apparatus 1 of this embodiment includes a slurry tank 2 for storing ceramic slurry S, a coating section 4 for applying the ceramic slurry S, fed from the slurry tank 2, onto a carrier film 3, an area weight-measuring section 5, functioning as a property-measuring section, for measuring an area weight as an example of a predetermined property related to the thickness of the ceramic slurry S applied on the carrier film 3, a drying oven 6 for drying the ceramic slurry S on the carrier film 3 to form a sheet, and a control section 7.

The ceramic slurry S stored in the slurry tank 2 is a mixture of a binder solution and ceramic raw material powder adjusted to have a predetermined composition.

At a position along a slurry-feeding channel 8 extending from the slurry tank 2 to the coating section 4, a slurry-discharging device 9 for discharging a predetermined quantity of slurry is placed, and specifically, it comprises a slurry pump. In this embodiment, the slurry-discharging device 9, which increases or decreases the quantity of slurry fed to the coating section 4 in response to thickness-adjusting signals transmitted from the control section 7, corresponds to a "thickness-adjusting device."

At another position along the slurry-feeding channel 8, a density-measuring instrument 10 for measuring the density of the ceramic slurry is also placed. The density data of the ceramic slurry determined by the density-measuring instrument 10 is input to the control section 7.

The coating section 4 includes a slurry coater 4a and a backing roll 4b which is arranged face to face with the slurry coater 4a so that a gap between them can be adjusted. The gap can be adjusted manually, but in this embodiment, it is mechanically adjusted by the operation of an actuator 4c.

The carrier film 3 is withdrawn from a feeding roll 11 and is transferred to a reeling roll 12. During this process, the carrier film 3 is transferred along a predetermined transfer route; through the gap between the slurry coater 4a and the backing roll 4b, where the ceramic slurry S is applied onto one side of the carrier film 3, and along the outer periphery of the backing roll 4b, and then into the area weight-measuring section 5.

The area weight-measuring section 5 has a function of measuring an area weight of the ceramic slurry S applied on the carrier film 3, together with an area weight of the carrier film 3, in a noncontact manner, by use of an upper head 5a and lower head 5b thereof. In this embodiment, the area weight-measuring section 5 includes a radiation thickness gauge, and specifically, includes a WG21-type "WEB-FREX" thickness gauge (trademark)manufactured by the Yokogawa Electric Corporation.

Here, the area weight is obtained by converting a measurement of a predetermined property, related to the coating thickness of the ceramic slurry S, into the area weight of a predetermined material whose measurement value is the same property as the above. Actually, a current value corresponding to a radiation attenuation amount is measured and then the obtained current value is converted into the area weight of aluminum foil.

The conversion method is as follows: the radiation attenuation amount and the area weights of aluminum foil sheets different in thickness are measured and a calibration curve showing the relationship between the radiation attenuation amount and the area weight is prepared in advance, and then, by use of the calibration curve, the obtained radiation attenuation amount of the slurry raw material is converted into an area weight.

A radiation thickness gauge has a function as determining the thickness of an object to be measured, by application of a radiation such as X-rays or β-rays, from an attenuation amount obtained when the radiation passes through the measured object. X-rays are used when the measured object principally contains relatively light elements or has a small area weight (less than or equal to 500 g/m$^2$), and β-rays are used when the measured object principally contains relatively heavy elements or has a large area weight (greater than 500 g/m$^2$ and less than or equal to 2000 g/m$^2$).

The radiation thickness gauge measures the area weight of an object to be measured, directly by scanning a fixed range of the object to be measured. In this embodiment, the area weight of an object to be measured, which is directly measured by the radiation thickness gauge, is referred to as a measured output from the area weight-measuring section 5.

Figure 2:
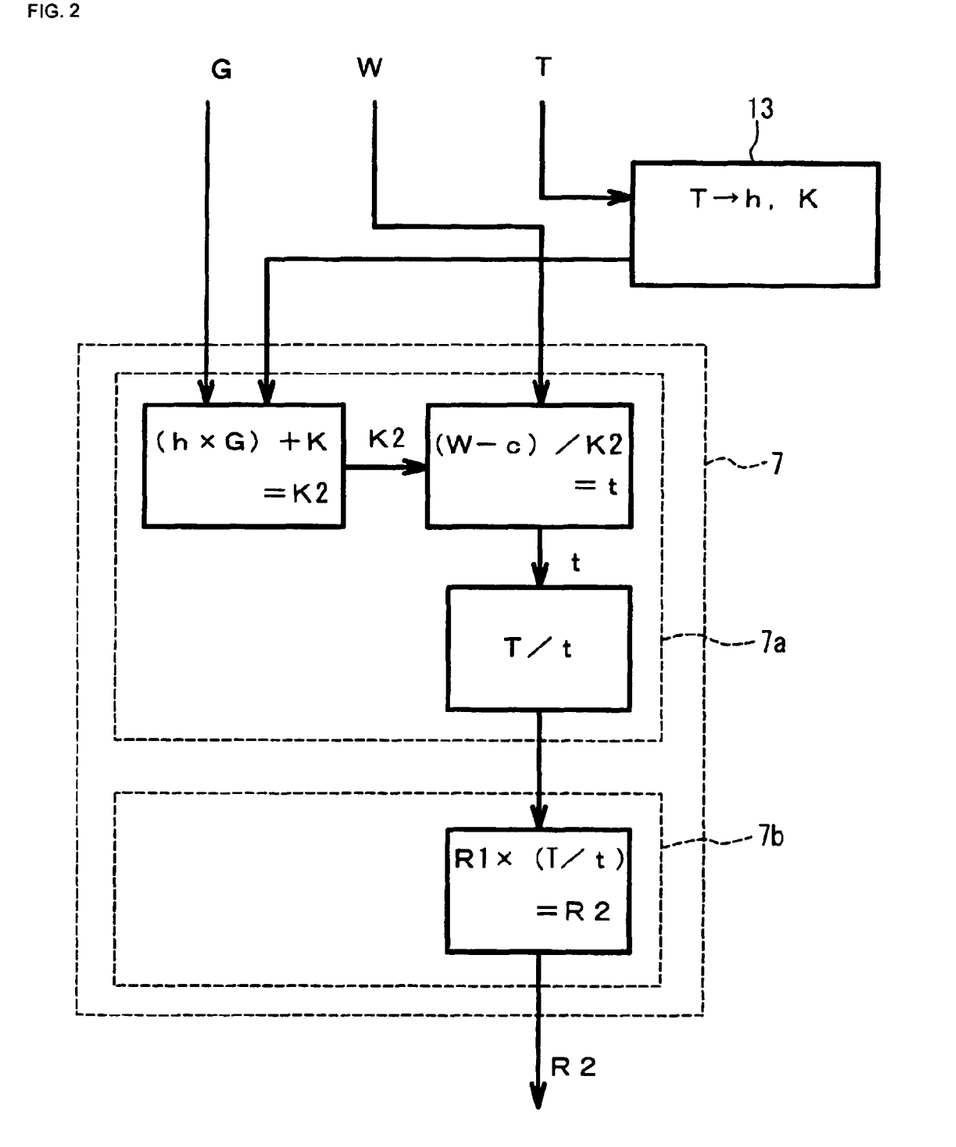
FIG. 2 is a block diagram showing the operation of a control section included in the apparatus shown in FIG. 1.

Referring now to FIG. 2, the control section 7 includes a microcomputer, for example, and its memory section, a memory 13, stores the data showing the relation among the area weight of the ceramic slurry S disposed on the carrier film 3 in a wet mode, the density of the ceramic slurry, and the thickness of a ceramic green sheet obtained by drying the ceramic slurry S, data on the calibration curve for converting a measurement obtained in the area weight-measuring section 5, into the area weight of the ceramic green sheet, and so on. These data have been obtained from various experiments conducted by the inventors and include not only numerical data but also expressions showing the relationship among different types of data, relational tables, and so on.

The control section 7, in this embodiment, has a function of taking necessary data in, that is, data on the target thickness of the ceramic green sheet (a target value of the sheet thickness), data on the area weight of the ceramic slurry on the carrier film 3, and data on the density of the ceramic slurry, and controlling the thickness of the ceramic green sheet on the basis of these data. From a functional viewpoint, the control section 7 includes a processing sub-section 7a for calculating an estimated value of the thickness of the green sheet to compare it with the target value, and an adjusting output sub-section 7b for outputting thickness-adjusting signals to the slurry-discharging device 9, which is a means for adjusting the thickness, on the basis of a comparison result obtained in the processing sub-section 7a.

A method for processing data in the control section 7, particularly a method for calculating an estimated value of the thickness of the green sheet, has been obtained from various experiments conducted by the inventors.

The inventors have conducted experiments to determine a conversion coefficient in various conditions for manufacturing, on assumption that the thickness of the ceramic green sheet obtained by drying the ceramic slurry can be determined by multiplying or dividing the area weight of the ceramic slurry S on the carrier film 3, by a certain conversion coefficient.

The thickness t of the ceramic green sheet can be determined according to the following equation:

$$t=(W-c)/K2 \quad (1)$$

wherein W represents the area weight of the ceramic slurry S disposed on the carrier film 3, K2 represents a conversion coefficient, and c represents the area weight of the carrier film 3.

Figure 3:
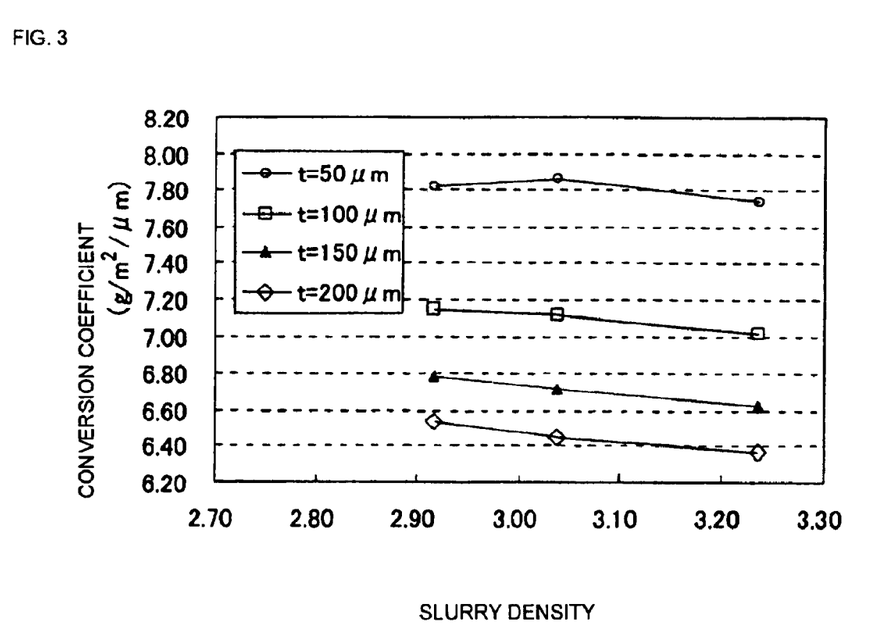
FIG. 3 is a graph showing the relationship in a case of manufacturing green sheets with different thicknesses.

From the results shown in FIG. 3 which were obtained by experiments for determining the conversion coefficient K2, the inventors have found that there are some rules that govern the relationship among the thickness t of the ceramic green sheet, the density G of the ceramic slurry, and the conversion coefficient K2, that is;

(A) The conversion coefficient K2 is greatly varied depending on the thickness of the ceramic green sheet; the conversion coefficient K2 is relatively small in case of making a thick ceramic green sheet, and it is large in case of making a thin one.

(B) In case of making ceramic green sheets with the same thickness, the conversion coefficient K2 is in inverse proportion to the density G of the ceramic slurry.

Then, the inventors have further studied the relationship between the density G of the ceramic slurry and the conversion coefficient K2 in a condition that the thickness of the ceramic green sheets to be prepared is fixed at a constant value. Some of the results are shown in FIGS. 4 and 5.

Figure 4:
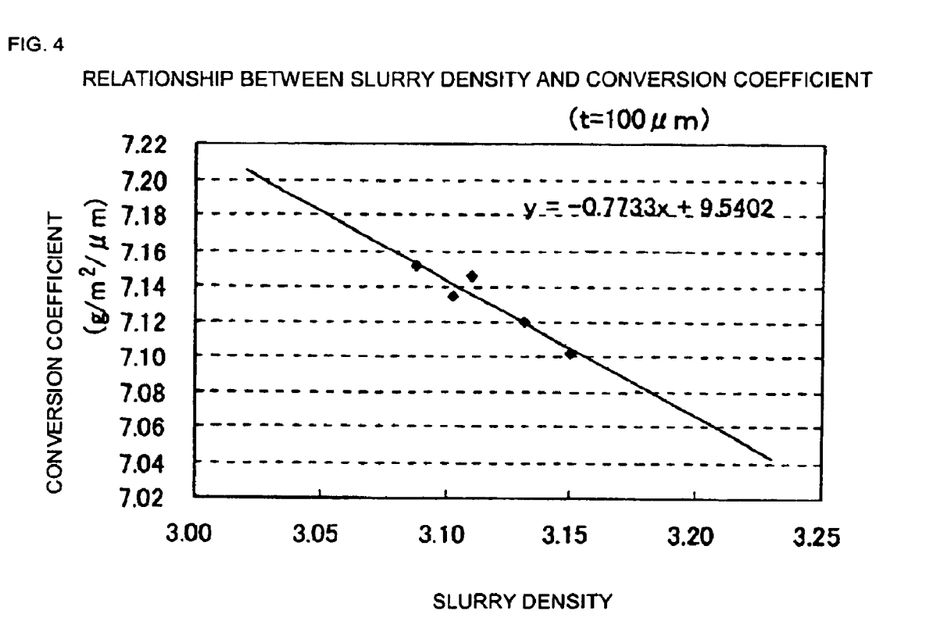
FIG. 4 is a graph showing the relationship in a case of manufacturing a green sheet with a particular thickness.

FIG. 4 shows the relationship between the density G of the ceramic slurry and the conversion coefficient K2, in case of preparing a ceramic green sheet with a thickness of 100 $\mu$m. FIG. 5 shows the relationship between the density G of the ceramic slurry and the conversion coefficient K2, in case of preparing a ceramic green sheet with a thickness of 200 $\mu$m. In these figures, obtained data are represented by the square dots or the small circles, linear equations induced from the data are represented by the straight lines extending across the regions where the dots and circles are placed.

Figure 5:
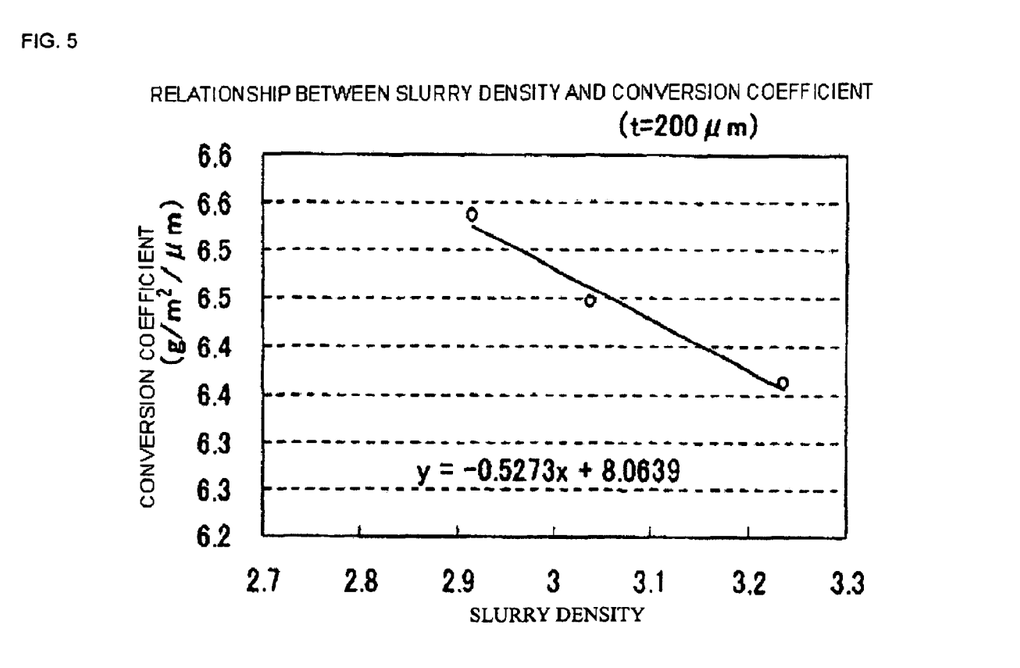
FIG. 5 is a graph showing the relationship in a case of manufacturing a green sheet with another particular thickness.

The results shown in FIGS. 4 and 5 tell us that the conversion coefficient K2 can be expressed by a linear equation where the density G of the ceramic slurry is an independent variable, and its coefficient and so on depend on the target thickness T of the ceramic green sheet.

The conversion coefficient K2 can be expressed by a linear equation. That is,

Generalization of the results shown in FIGS. 4 and 5 means that the conversion coefficient K2 can be determined according to the following linear equation (2):

$$K2=(h \times G)+k \quad (2)$$

wherein G is an independent variable, representing the density of the ceramic slurry, and h represents a correction coefficient determined according to the target thickness T of the ceramic green sheet, and k represents a correcting standard value.

As is clear from the results of the above experiments, the conversion coefficient K2 can be calculated by equation (2), from the target thickness T of the ceramic green sheet and the density G of the ceramic slurry. Furthermore, the use of the conversion coefficient K2 allows the thickness t of the green sheet to be calculated by equation (1) from the area weight W of the ceramic slurry on the carrier film.

In the above structure, the ceramic slurry S stored in the slurry tank 2 is fed to the slurry coater 4a by the slurry-discharging device 9 placed halfway in the slurry-feeding channel 8, and then is applied onto the one side of the carrier film 3, because the carrier film 3 has been transferred between an opening of the slurry coater 4a and the backing roll 4b.

The ceramic slurry S on the carrier film 3 is dried in the drying oven 6 to form the ceramic green sheet backed with the carrier film 3. In the present invention, however, the area weight of the ceramic slurry S on the carrier film 3 is measured in a wet mode in the area weight-measuring section 5 placed upstream of the drying oven 6. The data of an obtained measurement is input into the control section 7.

In addition to the data of the area weight of the ceramic slurry S on the carrier film 3, the data of the density G of the ceramic slurry is input from the density-measuring instrument 10 to the control section 7, where the data of the target thickness T of a green sheet has also been input in advance.

The control section 7 draws from its memory 13 equation (2) which includes the correction coefficient h and the correcting standard value k depended on the target thickness T of the ceramic green sheet, and calculates the conversion coefficient K2 by substituting the data of the density G of the ceramic slurry into equation (2), and then determines the thickness t (estimated value) of the green sheet according to equation (I) from the conversion coefficient K2 and the data of the area weight of the ceramic slurry of the carrier film 3.

The parameters used for calculating the thickness t (estimated value) of the green sheet are shown in Table 1.

TABLE 1

| T Target Thickness ($\mu$m) | t Sheet Thickness ($\mu$m) | W Data Obtained in Wet Mode (g/m$^2$) | c Carrier Film Thickness (g/m$^2$) | K2 Conversion Coefficient (g/m$^2$/$\mu$m) |
|---|---|---|---|---|
| 100 | 100 | 758.0 | 50.0 | 7.08 |
|  | 105 | 793.4 | 50.0 | 7.08 |
|  | 100 | 772.0 | 50.0 | 7.22 |
|  | 105 | 808.1 | 50.0 | 7.22 |
| 200 | 200 | 1326.0 | 50.0 | 6.38 |
|  | 205 | 1357.9 | 50.0 | 6.38 |
|  | 200 | 1346.0 | 50.0 | 6.48 |
|  | 205 | 1378.4 | 50.0 | 6.48 |

| T Target Thickness ($\mu$m) | t Sheet Thickness ($\mu$m) | K2 Conversion Coefficient (g/m$^2$/$\mu$m) | h Correction Coefficient | G Slurry Density Data | K Correcting Standard Value |
|---|---|---|---|---|---|
| 100 | 100 | 7.08 | −0.7733 | 3.18 | 9.5402 |
|  | 105 | 7.08 | −0.7733 | 3.18 | 9.5402 |
|  | 100 | 7.22 | −0.7733 | 3.00 | 9.5402 |
|  | 105 | 7.22 | −0.7733 | 3.00 | 9.5402 |
| 200 | 200 | 6.38 | −0.5273 | 3.18 | 8.0639 |
|  | 205 | 6.38 | −0.5273 | 3.18 | 8.0639 |
|  | 200 | 6.48 | −0.5273 | 3.00 | 8.0639 |
|  | 205 | 6.48 | −0.5273 | 3.00 | 8.0639 |

Next, the target value T and the estimated value t of the green sheet thickness are compared with each other, and then on the basis of a result of the comparison the quantity of the ceramic slurry discharged from the slurry-discharging device 9 is increased or decreased. When the slurry-discharging device 9 includes a slurry pump, the present revolution speed R1 of the slurry pump is multiplied by the ratio (T/t) of the target value T to the estimated value t of the sheet thickness, to obtain a new revolution speed R2. The thickness of the ceramic green sheet is adjusted to a predetermined value by increasing or decreasing the quantity of the discharged ceramic slurry according to a change in revolution speed of the slurry pump, for example.

In this procedure, since the weight of the ceramic slurry on the carrier film 3, which is the basis for estimation of the sheet thickness, is measured before drying, there is less loss of time in feedback of data and therefore the thickness can be the more efficiently controlled, as compared with the case in which the thickness of the green sheet is measured after the slurry is dried.

In addition, a section (the area weight-measuring section 5) for obtaining data used for controlling the thickness and a section (the coating section 4) to which the data is fed back are located to relatively near to each other, so that the amount of the material wasted without being subjected to the thickness control between the two sections can be reduced.

Furthermore, because every factor which is thought to have an effect on the sheet thickness is considered in the determination of the estimated value t of the sheet thickness, so the estimated value of the sheet thickness here is extremely close to an sheet thickness actually obtained after drying. Thus, the thickness can be precisely controlled with the estimated value of the sheet thickness.

In the above embodiment, the conversion coefficient K2 is determined by operation using equation (2) and the density of the ceramic slurry G. However, a conversion table such as Table 2, between the density G of the ceramic slurry and the conversion coefficient K2 according to each thickness target of green sheet, has been prepared, by which the conversion coefficient K2 may be determined.

TABLE 2

Conversion Coefficient-determining Table (t = 100 μm)

| G<br>Slurry Density | K2<br>Conversion Coefficient |
|---|---|
| 3.255–3.278 | 7 |
| 3.232–3.254 | 7.02 |
| 3.209–3.231 | 7.04 |
| 3.186–3.208 | 7.06 |
| 3.163–3.185 | 7.08 |
| 3.140–3.162 | 7.1 |
| 3.116–3.139 | 7.12 |
| 3.093–3.115 | 7.14 |
| 3.070–3.092 | 7.16 |
| 3.047–3.069 | 7.18 |
| 3.024–3.046 | 7.2 |
| 3.001–3.023 | 7.22 |
| 2.978–3.000 | 7.24 |

The density of the ceramic slurry is measured in the density-measuring instrument 10 placed halfway in the slurry-feeding channel 8 in real time and then the obtained data thereof is input to the control section 7. However, since the density of the ceramic slurry is not significantly varied, the density may be measured with another measuring means when new ceramic slurry is put in, and the obtained data may be then input in advance to the control section 7.

However, the following means may be used: In the above embodiment, the slurry-discharging device 9 functions as a thickness-adjusting means, but another device may be substituted as long as it can increase or decrease the quantity of the ceramic slurry applied onto the carrier film 3 according to commands transmitted from the control section 7. Therefore, the coating section 4 may be used as a thickness-adjusting means when the coating section 4 varies the quantity of the ceramic slurry applied onto the carrier film 3 by driving of the actuator 4c.

In the present invention, an estimated value of the thickness of a sheet is determined from the density of a slurry raw material on a carrier film and a predetermined property related to the coating thickness of the slurry raw material, and then on the basis of the estimation the quantity of the slurry raw material applied onto the carrier film is then increased or decreased, to control the sheet thickness. Herein, the area weight of the slurry raw material is measured and the obtained data is fed back before the slurry raw material is dried to form a sheet, so there is less loss of time in feedback and the thickness is the more efficiently controlled.

Furthermore, every factor which is thought to have an effect on the sheet thickness is considered in the determination of the estimated value of the sheet thickness, so the estimated value of the sheet thickness is extremely close to an sheet thickness actually obtained after drying. Thus, the thickness can be precisely controlled with the estimated value of the sheet thickness.

Although the present invention has been described in relation to particular embodiments thereof, many other variations and modifications and other uses will become apparent to those skilled in the art. Therefore, the present invention is not limited by the specific disclosure herein.

What is claimed is:

1. An apparatus for manufacturing a dry sheet from a slurry, comprising:

a coating section which coats a slurry raw material to be formed into a sheet, onto a carrier film transferred along a predetermined route;

a thickness-adjusting device which adjusts the thickness of the coating of the slurry raw material disposed on the carrier film;

a drying section which dries the slurry raw material disposed on the carrier film to form a sheet;

a property-measuring device which measures a predetermined property, related to the coating thickness of the slurry raw material disposed on the carrier film, in a wet mode before the material is dried in the drying section;

a density-measuring instrument which measures the density of the slurry raw material;

a memory section for storing data representative of a relation among the wet-mode measurement of the property of the slurry raw material disposed on the carrier film, the density of the slurry raw material, and the final thickness of the sheet obtained after the slurry raw material is dried;

an operational section which estimates a sheet thickness on the basis of the data stored in the memory section, the value of the property of the slurry raw material measured by the property-measuring device, and the density of the slurry raw material, and compares the estimated value with a target value of the sheet thickness; and an output adjusting section which transmits thickness-adjusting signals to the thickness-adjusting device in response to the comparison result obtained in the operational section.

2. The apparatus for manufacturing a sheet according to claim 1, wherein the property includes a radiation attenuation amount, and the property-measuring device includes a radiation thickness gauge which applies radiation to the slurry raw material in the thickness direction of the slurry raw material.

3. The apparatus for manufacturing a sheet according to claim 2, wherein said predetermined property is an area-weight of the slurry raw material.

4. The apparatus for manufacturing a sheet according to claim 1 or 2, wherein the thickness-adjusting device includes a slurry-discharging device for feeding a controlled amount of the slurry raw material to the coating section in response to the thickness-adjusting signals.

5. The apparatus for manufacturing a sheet according to claim 1 or 2, wherein the coating section includes a slurry coater and a backing roll which is arranged face to face with the slurry coater with an adjustable gap therebetween, the slurry coater being responsive to the thickness-adjusting signals and thereby functioning as said thickness-adjusting device.

6. The apparatus for manufacturing a sheet according to claim 1, wherein the density-measuring instrument for measuring the density of the slurry raw material is placed near at least one of a storing section where the slurry raw material is stored, or a channel through which the slurry raw material is fed.

7. The apparatus for manufacturing a sheet according to claim 1, wherein t, an estimated value of the final thickness of the sheet obtained after drying the slurry raw material on the carrier film, is determined according to the following equation (1):

$$t=(W-c)/K2 \tag{1}$$

where W represents an area weight obtained by converting a measurement of the property of the slurry raw material, before drying, disposed on the carrier film, into the area weight of a predetermined material with the same measurement of the property as the above; c represents an area weight obtained by converting a measurement of a property of the carrier film only, measured in the same manner as the slurry raw material on the carrier film, into the area weight of the predetermined material with the same measurement of the property as the above; and K2 represents a conversion coefficient determined by the following equation (2):

$$K2=(h\times G)+k \tag{2}$$

where h represents a correction coefficient and k represents a correcting standard value, both of which are determined according to the target thickness T of the sheet, and G represents the density of the slurry raw material.

8. The apparatus for manufacturing a sheet according to claim 1, wherein said predetermined property is an area-weight of the slurry raw material.

9. An apparatus for manufacturing a dry sheet from a slurry, comprising:

a coating section which coats a slurry raw material to be formed into a sheet, onto a carrier film transferred along a predetermined route;

a thickness-adjusting device which adjusts the thickness of the coating of the slurry raw material disposed on the carrier film;

a drying section which dries the slurry raw material disposed on the carrier film to form a sheet;

a property-measuring device which measures a predetermined property, related to the coating thickness of the slurry raw material disposed on the carrier film, in a wet mode before the material is dried in the drying section;

a density-measuring instrument which measures the density of the slurry raw material;

a memory section which stores data representative of a relation among the wet-mode measurement of the property of the slurry raw material disposed on the carrier film, the density of the slurry raw material, and the final thickness of the sheet obtained after the slurry raw material is dried;

an operational section which estimates a sheet thickness on the basis of the data stored in the memory section, the value of the property of the slurry raw material measured by the property-measuring device, and the density of the slurry raw material, and compares the estimated value with a target value of the sheet thickness; and an output adjusting section which transmits thickness-adjusting signals to the thickness-adjusting device in response to the comparison result obtained in the operational section.

10. The apparatus for manufacturing a sheet according to claim 9, wherein said predetermined property is an area-weight of the slurry raw material.

* * * * *